United States Patent
Tai et al.

(10) Patent No.: US 10,157,808 B2
(45) Date of Patent: Dec. 18, 2018

(54) PACKAGE STRUCTURE AND METHOD OF FORMING PACKAGE STRUCTURE

(71) Applicant: TAIWAN SEMICONDUCTOR MANUFACTURING CO., LTD., Hsinchu (TW)

(72) Inventors: Chih-Hsuan Tai, Taipei (TW);
Ting-Ting Kuo, Hsinchu (TW);
Yu-Chih Huang, Hsinchu (TW);
Chih-Hua Chen, Hsinchu (TW);
Hao-Yi Tsai, Hsinchu (TW);
Chung-Shi Liu, Hsinchu (TW);
Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/679,027

(22) Filed: Aug. 16, 2017

(65) Prior Publication Data
US 2018/0286776 A1    Oct. 4, 2018

Related U.S. Application Data

(60) Provisional application No. 62/478,933, filed on Mar. 30, 2017.

(51) Int. Cl.
| | | |
|---|---|---|
| H04L 23/00 | (2006.01) | |
| H01L 23/31 | (2006.01) | |
| H01L 23/528 | (2006.01) | |
| H01L 23/522 | (2006.01) | |
| H01L 21/56 | (2006.01) | |
| H01L 21/48 | (2006.01) | |
| H01L 23/00 | (2006.01) | |

(52) U.S. Cl.
CPC ........ *H01L 23/3128* (2013.01); *H01L 21/486* (2013.01); *H01L 21/561* (2013.01); *H01L 21/568* (2013.01); *H01L 23/528* (2013.01); *H01L 23/5226* (2013.01); *H01L 21/4853* (2013.01); *H01L 24/13* (2013.01); *H01L 2224/13147* (2013.01)

(58) Field of Classification Search
CPC .......................... H01L 23/5389; H01L 21/561
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — William Harriston
(74) *Attorney, Agent, or Firm* — Maschoff Brennan

(57) ABSTRACT

A package structure includes a semiconductor device, a first molding compound, a through-via, a first dielectric layer, a first redistribution line, and a second molding compound. The first molding compound is in contact with a sidewall of the semiconductor device. The through-via is in the first molding compound and is electrically connected to the semiconductor device. The first dielectric layer is over the semiconductor device. The first redistribution line is in the first dielectric layer and is electrically connected to the semiconductor device and the through-via. The second molding compound is in contact with a sidewall of the first dielectric layer.

20 Claims, 9 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0299999 A1* | 10/2014 | Hu .................. H01L 21/56 257/774 |
| 2015/0171006 A1* | 6/2015 | Hung .............. H01L 23/5226 257/774 |
| 2015/0179616 A1* | 6/2015 | Lin .................. H01L 25/50 257/773 |
| 2016/0300797 A1* | 10/2016 | Shim, II .......... H01L 23/5389 |

\* cited by examiner

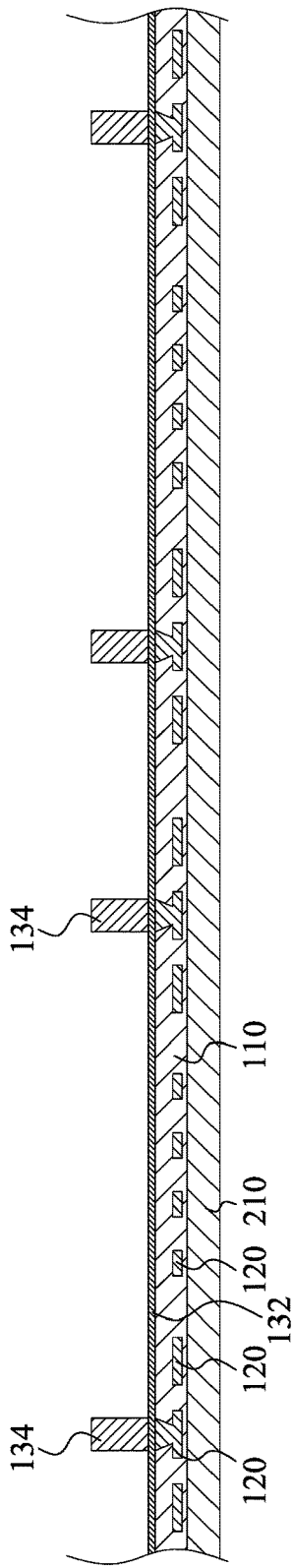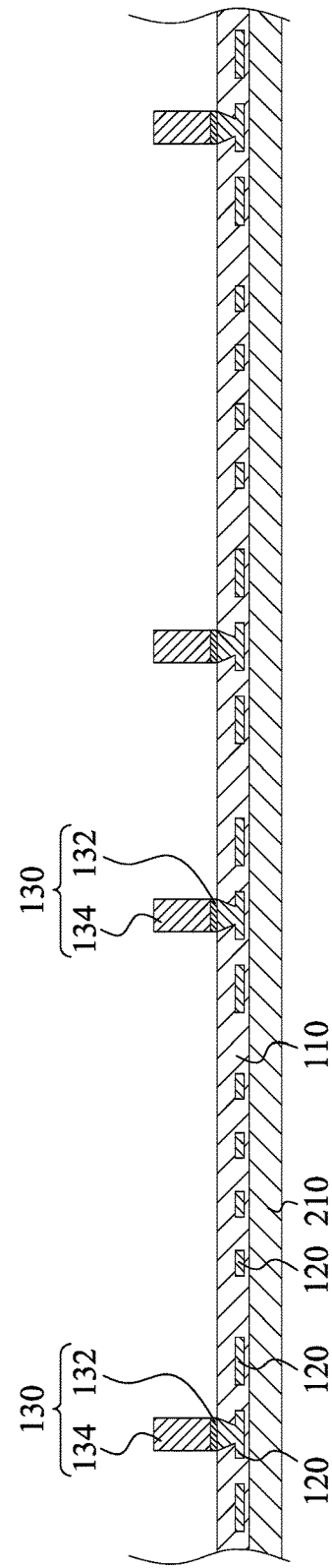

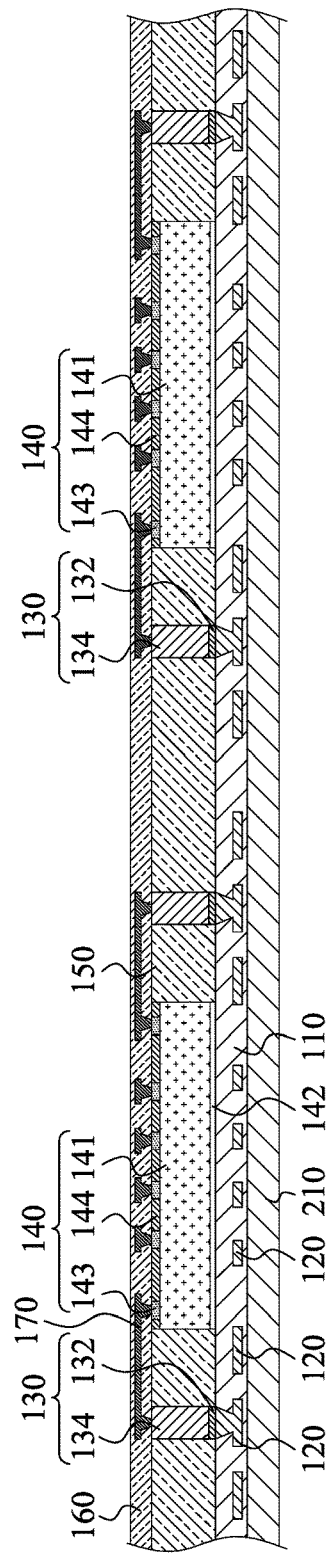
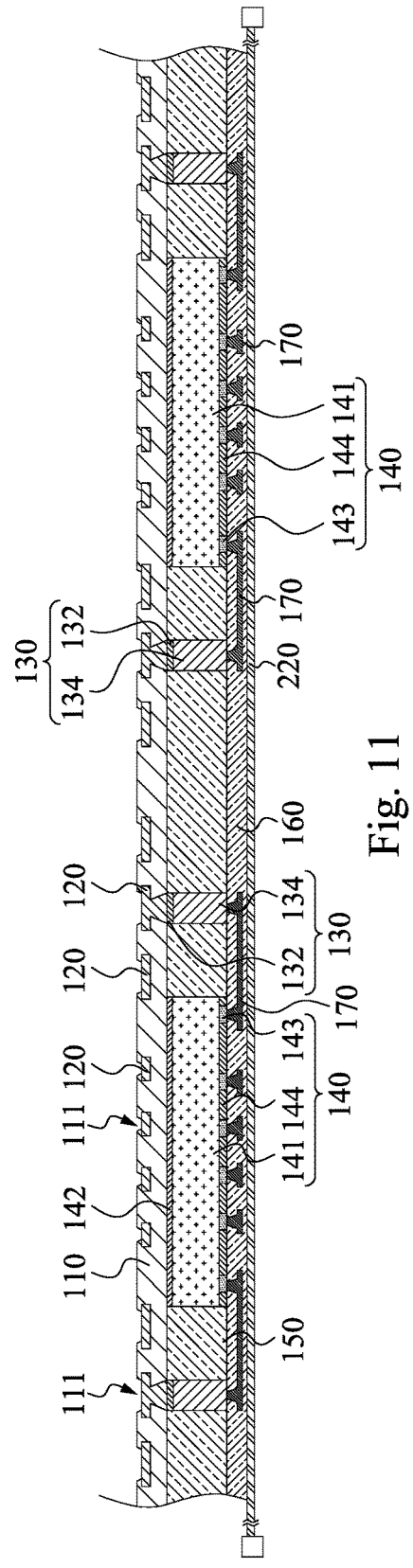
Fig. 10
Fig. 11

PACKAGE STRUCTURE AND METHOD OF FORMING PACKAGE STRUCTURE

PRIORITY CLAIM AND CROSS-REFERENCE

This application claims priority to U.S. Provisional Application Ser. No. 62/478,933, filed Mar. 30, 2017, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components are also configured with smaller packages in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-16 are cross-sectional views of a package structure at various stages in accordance with some embodiments of the present disclosure.

DETAILED DESCRIPTION

Figure 1:
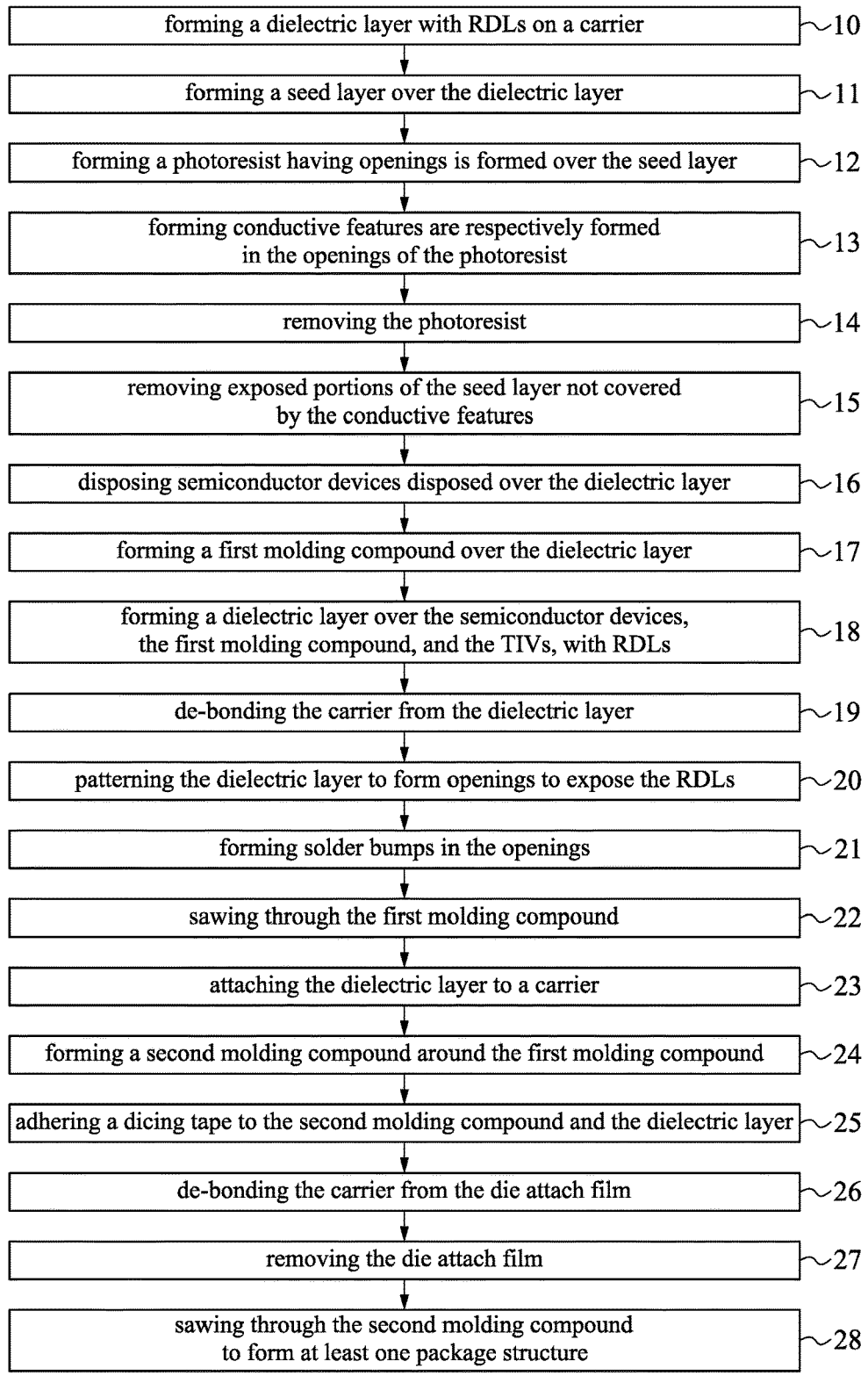
FIG. 1 is a flowchart of a method of forming a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
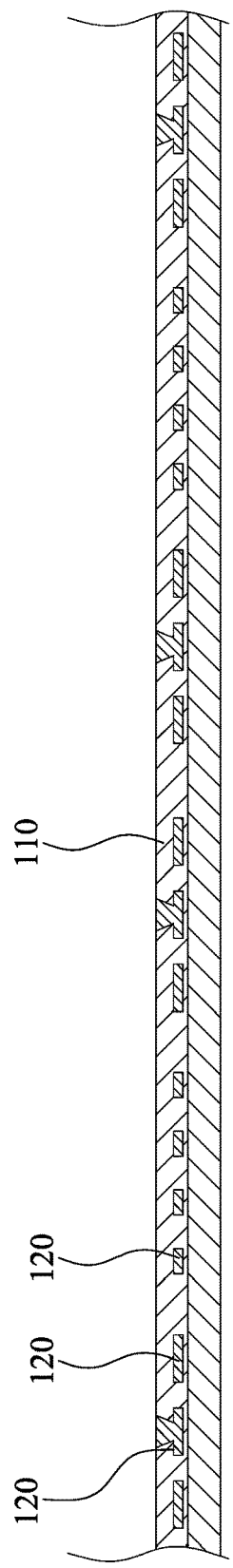

FIG. 1 is a flowchart of a method of forming a package structure in accordance with some embodiments of the present disclosure. FIGS. 2-16 are cross-sectional views of the package structure at various stages in accordance with some embodiments of the present disclosure. The method begins with block 10 of FIG. 1 in which a dielectric layer 110 with RDLs 120 is formed on a carrier 210. Referring to FIG. 2, the dielectric layer 110 is formed on the carrier 210. The carrier 210 may be a blank glass carrier, a blank ceramic carrier, or the like. The dielectric layer 110 may be a polymer layer. The polymer layer may include, for example, polyimide, polybenzoxazole (PBO), benzocyclobutene (BCB), an ajinomoto buildup film (ABF), a solder resist film (SR), or the like. Moreover, the RDLs 120 are formed in the dielectric layer 110, and portions of the RDLs 120 are exposed through the dielectric layer 110. In some embodiments, the formation of one layer of the RDLs 120 includes forming a blanket copper seed layer, forming and patterning a mask layer over the blanket copper seed layer, performing a plating to form the RDLs 120, removing the mask layer, and performing a flash etching to remove the portions of the blanket copper seed layer not covered by the RDLs 120. In alternative embodiments, the RDLs 120 are formed by depositing metal layers, patterning the metal layers, and filling gaps between the RDLs 120 with the dielectric layers 110. One layer of the RDLs 120 shown in FIG. 2 is for illustration, and various embodiments of the present disclosure are not limited in this regard. In alternative embodiments, the dielectric layer 110 with plural layers of the RDLs 120 is formed on the carrier 210.

Figure 3:
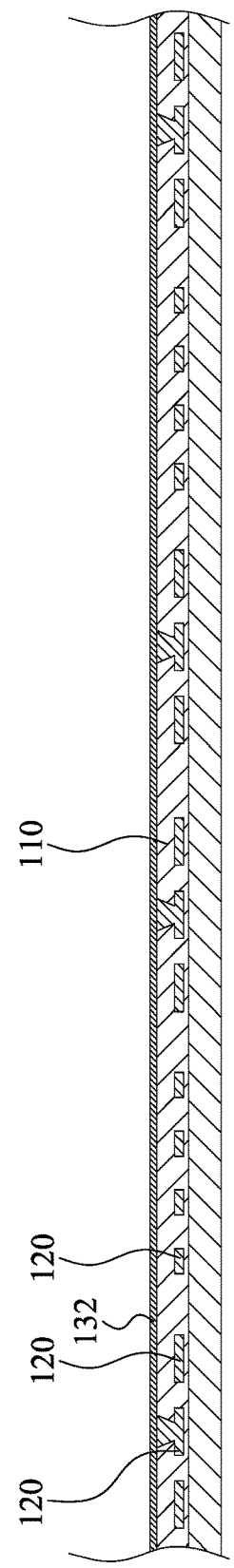

The method continues with block 11 of FIG. 1. Referring to FIG. 3, a seed layer 132 is formed over the dielectric layer 110 and the exposed RDLs 120, for example, through PVD or metal foil laminating. The seed layer 132 may include copper, copper alloy, aluminum, titanium, titanium alloy, or combinations thereof. In some embodiments, the seed layer 132 includes a titanium layer and a copper layer over the titanium layer. In alternative embodiments, the seed layer 132 is a copper layer.

Figure 4:
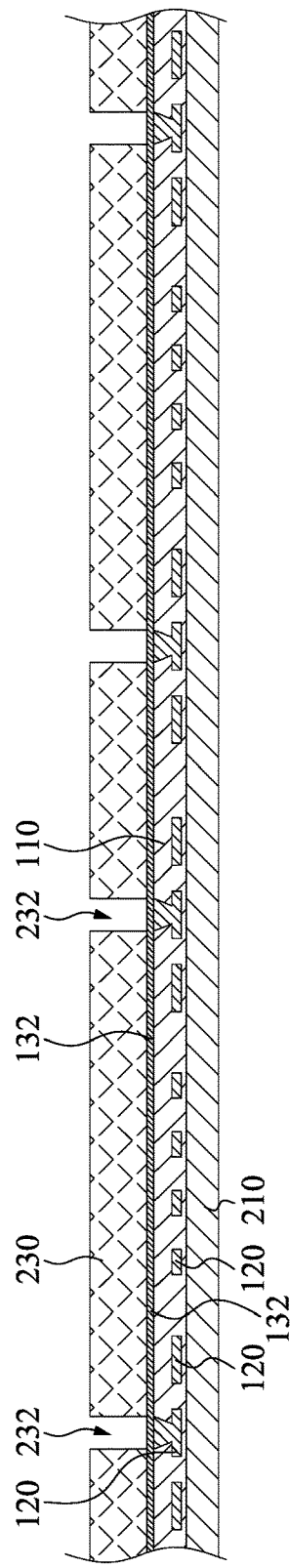

The method continues with block 12 of FIG. 1 in which a photoresist 230 having openings 232 is formed over the seed layer 132. Referring to FIG. 4, the photoresist 230 is applied over the seed layer 132 and is then patterned to expose some portions of the seed layer 132. As a result, the openings 232 are formed in the photoresist 230, through which some portions of the seed layer 132 are exposed.

Figure 5:
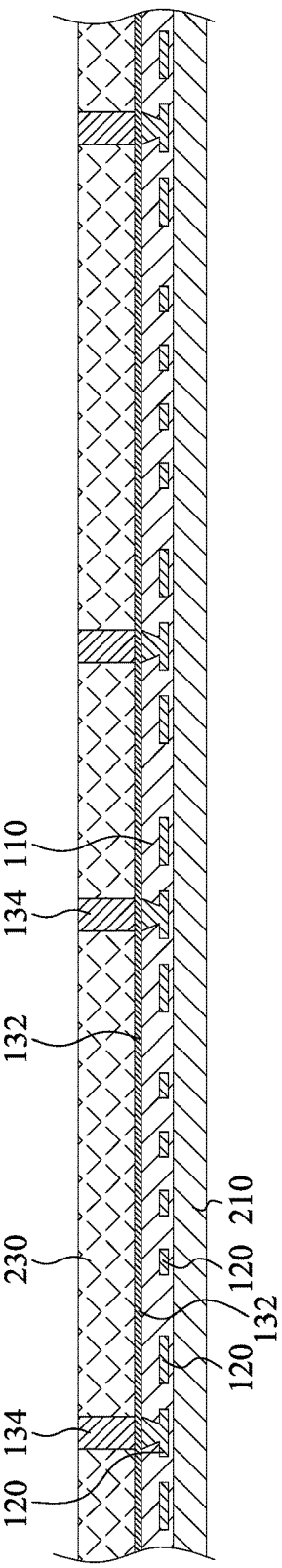

The method continues with block 13 of FIG. 1. Reference is made to FIG. 5. Conductive features 134 are respectively formed in the openings 232 of the photoresist 230 through, for example, plating, which may be electro plating, electroless plating, or metal-paste printing. The conductive features 134 are plated on the exposed portions of the seed layer 132 underlying the openings 232, respectively. The conductive features 134 may include copper, aluminum, tungsten, nickel, solder, silver or alloys thereof. Top-view shapes of the third conductive features 134 may be rectangles, squares, circles, or the like. Heights of the third conductive features 134 are determined by the thickness of the subsequently placed semiconductor devices 140 (see FIG. 8).

The method continues with block 14 of FIG. 1. After the plating of the conductive features 134, the photoresist 230 is removed, and the resulting structure is shown in FIG. 6. After the photoresist 230 is removed, some portions of the seed layer 132 are exposed.

The method continues with block 15 of FIG. 1. Reference is made to FIG. 7. An etch step is performed to remove the exposed portions of seed layer 132 that are not covered by the conductive features 134, wherein the etch step may include an anisotropic etching. Some portions of the seed layer 132 that are covered by the third conductive features 134, on the other hand, remain not etched. Throughout the description, the conductive features 134 and the remaining underlying portions of the seed layer 132 are in combination referred to as through integrated fan-out (InFO) vias (TIVs) 130, which are also referred to as through-vias. Although the seed layer 132 is shown as a layer separate from the conductive features 134, when the seed layer 132 is made of a material similar to or substantially the same as the respective overlying third conductive features 134, the seed layer 132 may be merged with the third conductive features 134 substantially free from distinguishable interface therebetween. In alternative embodiments, there exist distinguishable interfaces between the seed layer 132 and the overlying conductive features 134.

Figure 8:
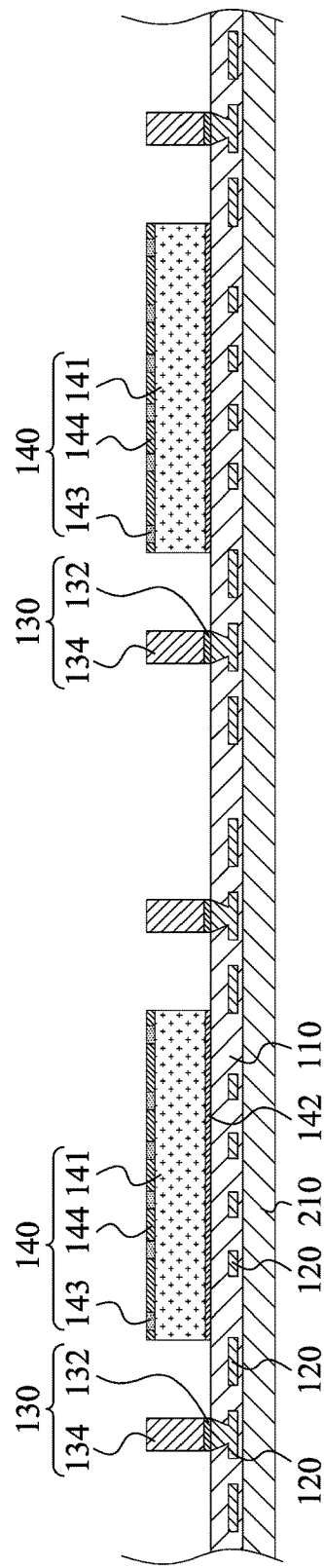

The method continues with block 16 of FIG. 1. FIG. 8 illustrates placement of the semiconductor devices 140 on the dielectric layer 110. The semiconductor devices 140 may be disposed on the dielectric layer 110 through adhesives 142. The semiconductor devices 140 may be logic semiconductor devices including logic transistors therein. In some embodiments, the semiconductor devices 140 are designed for mobile applications, and may be central processing unit (CPU) dies, sensor dies, or the like. Each of the semiconductor devices 140 includes a semiconductor substrate 141 (a silicon substrate, for example) that contacts the adhesive 142, in which the back surface of the semiconductor device 140 (i.e., the lower surface) is in contact with the adhesive 142.

In some embodiments, conductive pads 143 (such as copper posts) are formed as the top portions of the semiconductor devices 140, and are electrically coupled to the devices such as transistors (not shown) in the semiconductor devices 140. In some embodiments, a dielectric layer 144 is formed on the top surface of the respective semiconductor device 140, with the conductive pads 143 having at least lower portions in the dielectric layer 144. The top surfaces of the conductive pads 143 may be substantially level with the top surfaces of the dielectric layers 144 in some embodiments. Alternatively, the dielectric layers 144 are not formed, and the conductive pads 143 protrude from the respective semiconductor device 140 (this arrangement is not shown).

Figure 9:
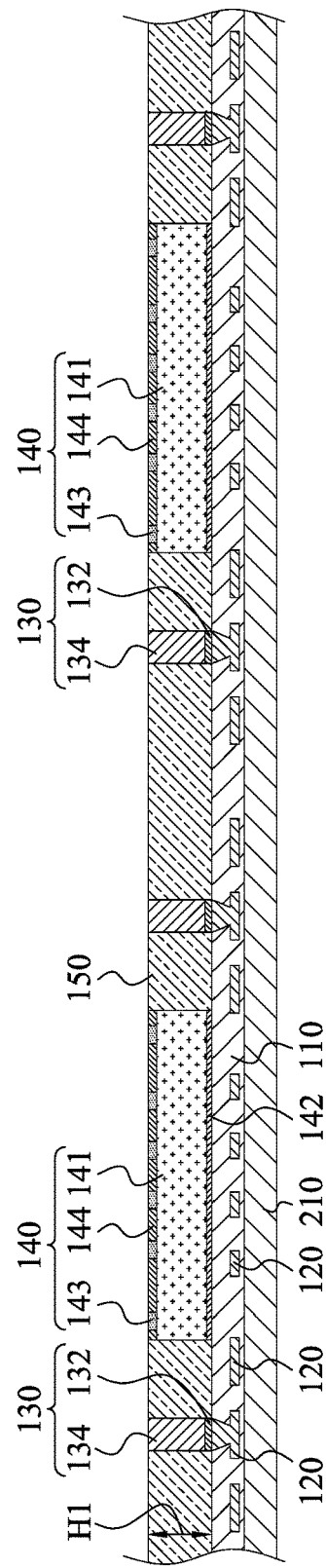

The method continues with block 17 of FIG. 1. Referring to FIG. 9, a first molding compound 150 is formed on the dielectric layer 110 to be in contact with the semiconductor devices 140 and the TIVs 130. The first molding compound 150 is molded around the semiconductor devices 140 and the TIVs 130. The first molding compound 150 fills gaps between the semiconductor devices 140 and the TIVs 130, and may be in contact with the dielectric layer 110. In some embodiments, the first molding compound 150 includes a polymer-based material. The term "polymer" can represent thermosetting polymers, thermoplastic polymers, or combinations thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof.

In some embodiments, the molding is an expose molding, wherein the top surfaces of the semiconductor devices 140 and the TIVs 130 are exposed through the first molding compound 150. Furthermore, the molding may be performed using transfer molding. In some embodiments, the molding is performed using mold (not shown) to cover the top surfaces of the semiconductor devices 140 and the TIVs 130, so that the resulting first molding compound 150 will not cover the top surfaces of the semiconductor devices 140 and the TIVs 130. During the transfer molding, the inner space of the mold is vacuumed, and molding material is injected into the inner space of the mold to form the first molding compound 150.

The resulting structure is shown in FIG. 9, in which the first molding compound 150 is in contact with sidewalls of the semiconductor devices 140 and the TIVs 130. Due to the expose molding, the top ends of the TIVs 130 and top ends of the conductive pads 143 are substantially level (coplanar) with the top surface of the first molding compound 150. As a result, the thickness H1 of the first molding compound 150 and the thickness of the TIVs 130 are substantially the same. That is, the TIVs 130 extend through the first molding compound 150.

The method continues with block 18 in which a dielectric layer 160 is formed over the semiconductor devices 140, the first molding compound 150, and the TIVs 130, with RDLs 170. Referring to FIG. 10, the dielectric layer 160 is formed over the first molding compound 150, the semiconductor devices 140, and the TIVs 130, such that the first molding compound 150, the semiconductor devices 140, and the TIVs 130 are between the dielectric layer 110 and the dielectric layer 160. Moreover, the RDLs 170 are formed in the dielectric layer 160 and over the first molding compound 150 to be electrically connected to the semiconductor devices 140 and the TIVs 130. In other words, the dielectric layer 160 is formed over the semiconductor devices 140, the first molding compound 150, and the TIVs 130, with the RDLs 170. In some embodiments, the formation of one layer of the RDLs 170 includes forming a blanket copper seed layer, forming and patterning a mask layer over the blanket copper seed layer, performing a plating to form the RDLs 170, removing the mask layer, and performing a flash etching to remove the portions of the blanket copper seed layer not covered by the RDLs 170. In alternative embodiments, the RDLs 170 are formed by depositing metal layers, patterning the metal layers, and filling gaps between the RDLs 170 with the dielectric layers 160.

The RDLs 170 may include a metal or a metal alloy including aluminum, copper, tungsten, and/or alloys thereof. The dielectric layer 160 in these embodiments may include a polymer such as polyimide, benzocyclobutene (BCB), polybenzoxazole (PBO), or the like. Alternatively, the dielectric layer 160 may include inorganic dielectric materials such as silicon oxide, silicon nitride, silicon carbide, silicon oxynitride, or the like.

The method continues with block 19 of FIG. 1. Referring to FIG. 11, after the dielectric layer 160 and the RDLs 170 are formed over the TIVs 130, the semiconductor devices 140, and the first molding compound 150, a dicing tape 220 is adhered to the dielectric layer 160. Next, the structure of FIG. 10 with the dicing tape 220 may be flipped over, and then the carrier 210 is de-bonded from the dielectric layer 110.

The method continues with block 20 of FIG. 1. After the carrier 210 is de-bonded from the dielectric layer 110, the dielectric layer 110 is patterned to form openings 111 to at least partially expose the RDLs 120, and the resulting structure is shown in FIG. 11. In some embodiments, the openings 111 may be formed in the dielectric layer 110 by laser drill, although photolithography processes may also be used.

Figure 12:
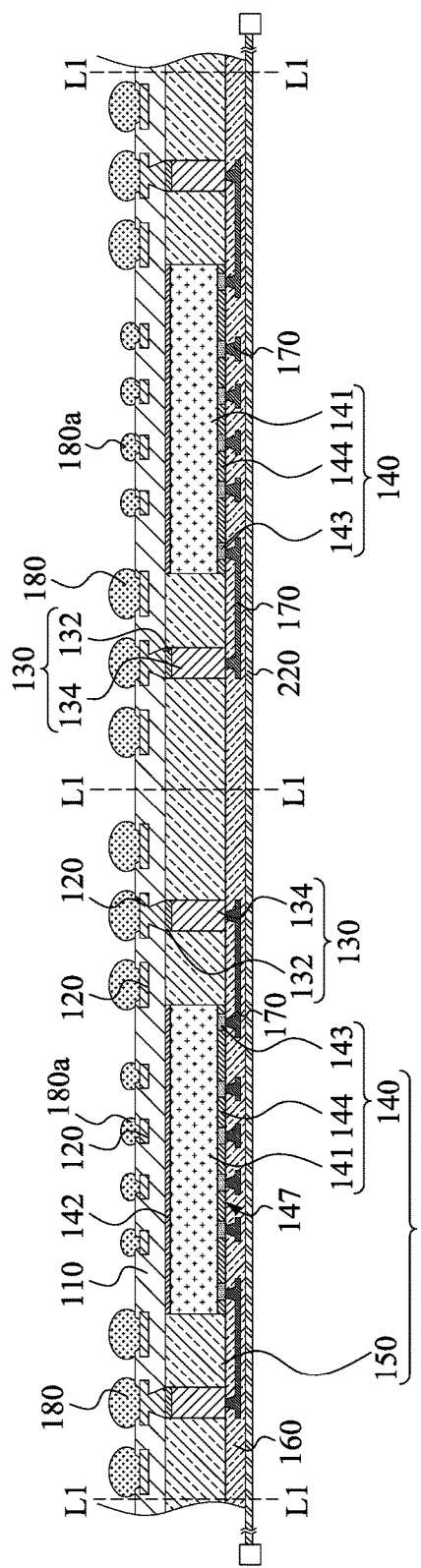

The method continues with block 21 of FIG. 1, in which solder bumps 180 and 180a are formed in the opening 111. Referring to FIG. 12, the solder bumps 180 and 180a are formed on the exposed portions of the RDLs 120. The solder bumps 180 and 180a may be formed by a solder paste printing process that is applied to the exposed RDLs 120. According to the locations of the exposed RDLs 120, a stencil may be employed to print the solder paste on top of the RDLs 120. A reflow process is applied so that the solder paste may coalesce into the solder bumps 180 and 180a on top of the RDLs 120. In some embodiments, the size of the solder bumps 180 is different from that of the solder bumps 180a. For example, the solder bumps 180a are smaller than the solder bumps 180.

The method continues with block 22 of FIG. 1 in which the first molding compound 150 is sawed through. Referring to FIG. 12, after the solder bumps 180 and 180a are formed, a singulation process is carried out to saw through the dielectric layer 110, the first molding compound 150, and the dielectric layer 160 along lines L1, such that plural chip-scale packages 155 on the dicing tape 220 may be formed.

Figure 13:
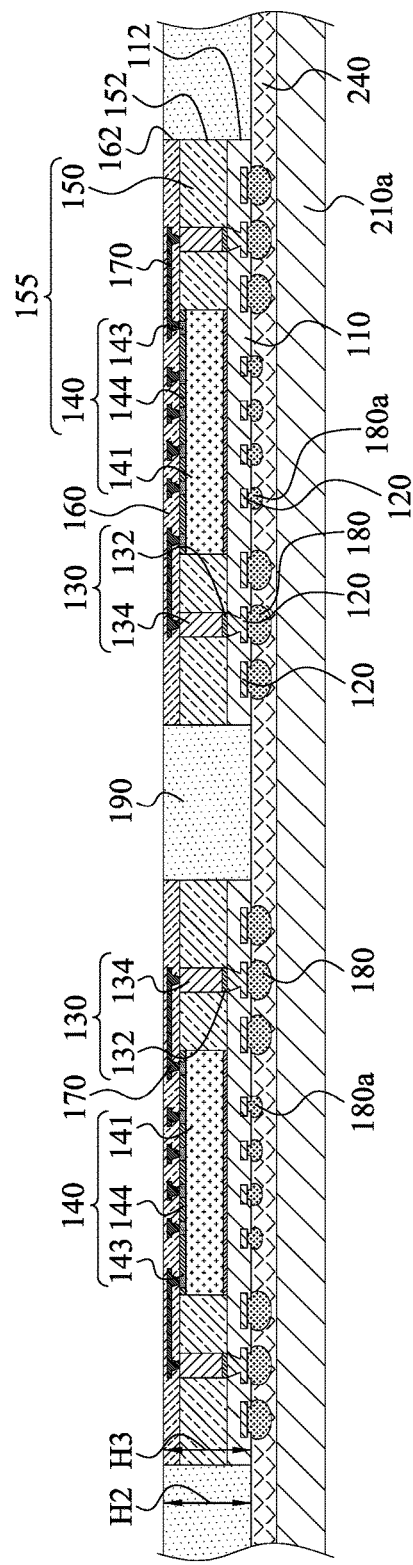

The method continues with block 23 of FIG. 1 in which the dielectric layer 110 is attached to a carrier 210a. Referring to FIG. 13, after the sawing step, the chip-scale packages 155 are picked from the dicing tape 220, and then the picked packages 155 are placed on a die attach film (DAF) 240 over the carrier 210a. Therefore, the die attach film 240 on the carrier 210a can cover the solder bumps 180, 180a, and the dielectric layer 110 for protection. In other words, the solder bumps 180 and 180a are embedded in the die attach film 240. The number of the picked packages 155 shown in FIG. 13 is for illustration, and various embodiments of the present disclosure are not limited in this regard. In some embodiments, the carrier 210a may be the same as the carrier 210 shown in FIGS. 2-10. In alternatively embodiments, the carrier 210a is different from the carrier 210, and various embodiments of the present disclosure are not limited in this regard. For example, the carrier 210a may be a blank glass carrier, a blank ceramic carrier, or the like.

The method continues with block 24 of FIG. 1 in which a second molding compound 190 is formed around the first molding compound 150. Referring to FIG. 13, after the packages 155 are placed on the die attach film 240, the second molding compound 190 is molded around the packages 155. The dielectric layer 110, the dielectric layer 160, and the first molding compound 150 are surrounded by the second molding compound 190. The bottom surface of the dielectric layer 110 is substantially coplanar with the bottom surface of the second molding compound 190, and the top surface of the dielectric layer 160 is substantially coplanar with the top surface of the second molding compound 190.

The second molding compound 190 may be a polymer, a resin, or the like. The second molding compound 190 and the first molding compound 150 may be made of the same material or different materials, and various embodiments of the present disclosure are not limited in this regard. In some embodiments, the second molding compound 190 comprises a molding underfill, which acts as a molding compound and an underfill. Accordingly, the second molding compound 190 is filled into the gap between two neighboring packages 155, and may be in contact with, and surround, the packages 155.

In some embodiments, the molding is an expose molding, wherein the top surfaces of the packages 155 are exposed through the second molding compound 190. Furthermore, the molding may be performed using transfer molding. In some embodiments, the molding is performed using a mold (not shown) to cover the top surfaces of the packages 155, so that the resulting second molding compound 190 will not cover the top surfaces of packages 155. During the transfer molding, the inner space of the mold is vacuumed, and molding material is injected into the inner space of the mold to form the second molding compound 190.

Due to the expose molding, the top surface of the second molding compound 190 may be substantially level with the top surfaces of the packages 155. In some embodiments, the top surface of the second molding compound 190 is substantially coplanar with the top surfaces of the packages 155. In alternative embodiments, the top surface of the second molding compound 190 is slightly lower than the top surfaces of the packages 155, and various embodiments of the present disclosure are not limited in this regard.

The second molding compound 190 is formed around the dielectric layer 160, the first molding compound 150, and the dielectric layer 110. Moreover, the thickness H2 of the second molding compound 190 is substantially the same as the total thickness H3 of the first molding compound 150, the dielectric layer 110, and the dielectric layer 160 of the respective package 155.

Since the second molding compound 190 molds the packages 155, the ratio of the area of each of the package 155 to the area of the corresponding semiconductor device 140 can be reduced. As a result, during the manufacturing process of the packages 155 (e.g., FIGS. 2 to 12), the warpage of the packages 155 can be prevented due to the decrease of the first molding compound 150, thereby improving the process yield and the reliability yield of the packages 155.

Figure 14:
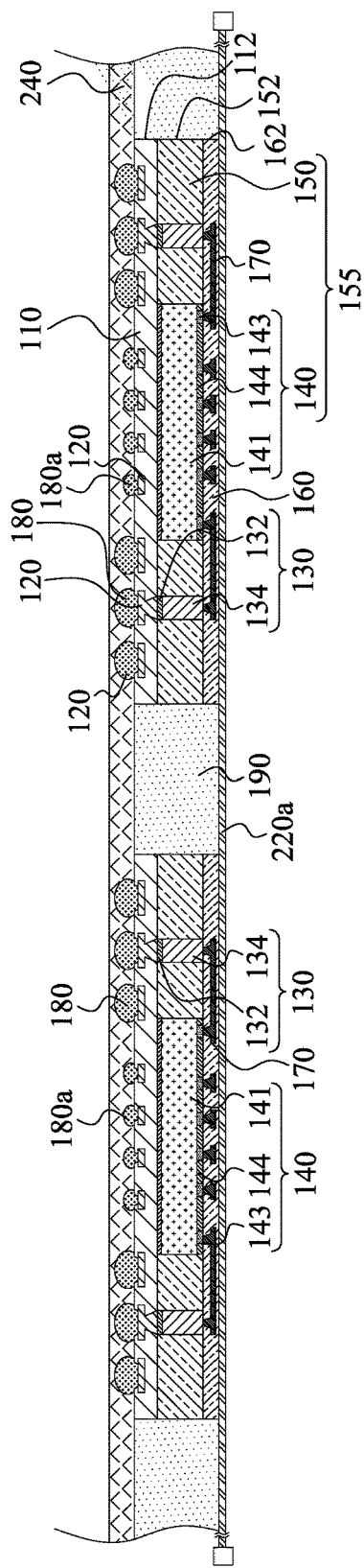

The method continues with blocks 25 and 26 of FIG. 1. Referring to FIG. 14, after the formation of the second molding compound 190, a dicing tape 220a is adhered to the second molding compound 190 and the dielectric layer 160. Next, the structure of FIG. 13 with the dicing tape 220a may be flipped over, and then the carrier 210a is de-bonded from the die attach film 240. The resulting structure is shown in FIG. 14. In some embodiments, the dicing tape 220a may be the same as the dicing tape 220 shown in FIGS. 11 and 12. In alternative embodiments, the dicing tape 220a is different from the dicing tape 220, and various embodiments of the present disclosure are not limited in this regard.

Figure 15:
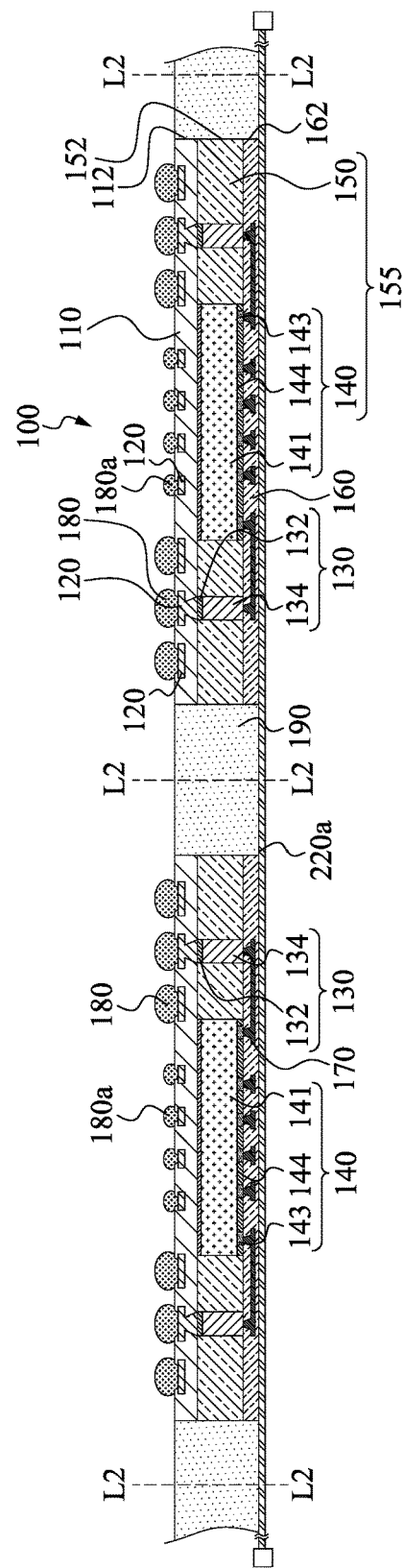

The method continues with block 27 of FIG. 1 in which the die attach film 240 is removed. Referring to FIG. 15, after the carrier 210a is removed, the die attach film 240 is cleaned from the packages 155, such that the solder bumps 180, 180a, and the dielectric layer 110 are exposed.

Figure 16:
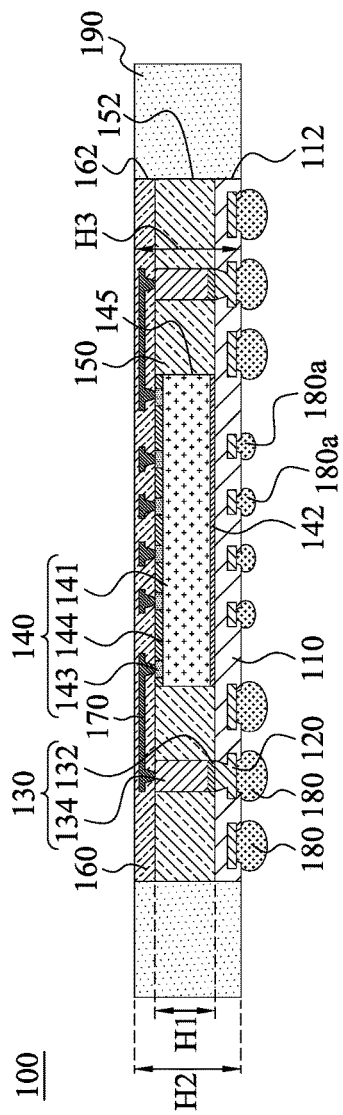
Figure 17:
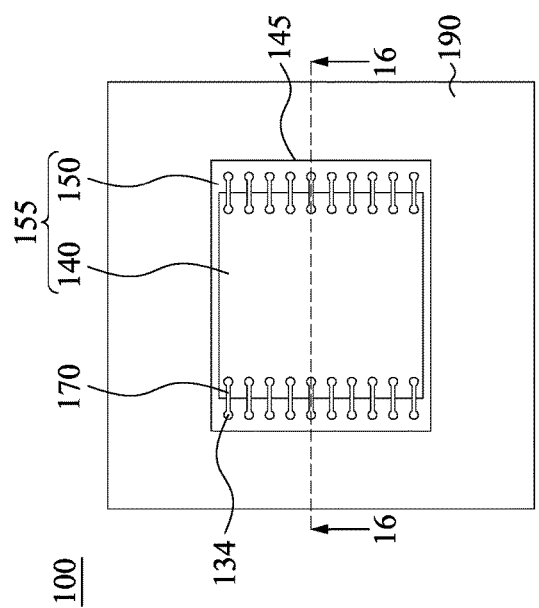
FIG. 17 is a top view of a package structure according to some embodiments of the present disclosure.

The method continues with block 28 in which the second molding compound 190 is sawed through to form at least one package structure 100. Referring to FIG. 15, a sawing step is carried out to sawing through the structure of FIG. 15 along lines L2. As a result, the second molding compound 190 with embedded packages 155 is sawed through to form plural individual packages, and each of the packages has the semiconductor device 140, the first molding compound 150, and the second molding compound 190. In other words, after the sawing step, at least one package structure 100 is picked from the dicing tape 220*a*, such that the package structure 100 as shown in FIGS. 16 and 17 can be obtained. In the sawing step, the size of the package structure 100 may be determined by the sawing positions of the second molding compound 190, and hence a desired size of the package structure 100 can be achieved.

FIG. 16 is a cross-sectional view of the package structure 100 taken along line 16-16 shown in FIG. 17. Since the thickness H2 of the second molding compound 190 is substantially the same as the total thickness H3 of the first molding compound 150, the dielectric layer 110, and the dielectric layer 160, the thickness H1 of the first molding compound 150 is smaller than the thickness H2 of the second molding compound 190. Moreover, the first molding compound 150 is in contact with a sidewall 145 of the semiconductor device 140. The second molding compound 190 is in contact with a sidewall 112 of the dielectric layer 110, a sidewall 152 of the first molding compound 150, and a sidewall 162 of the dielectric layer 160. Stated differently, the dielectric layer 110 and the second molding compound 190 have an interface, the first molding compound 150 and the second molding compound 190 have an interface, and the dielectric layer 160 and the second molding compound 190 have an interface.

FIG. 17 is a top view of the package structure 100 according to some embodiments of the present disclosure. The semiconductor device 140 is surrounded by the first molding compound 150, and the first molding compound 150 is surrounded by the second molding compound 190. In other words, the first molding compound 150 is located between the semiconductor device 140 and the second molding compound 190, and thus the second molding compound 190 is free from the conductive features 134. Because the second molding compound 190 is formed after the formation of the package 155, the second molding compound 190 can expand the package structure 100 to a desired size.

In the aforementioned package structure, two molding steps are utilized to form the package structure. The final size of the package structure can be determined through different areas of the second molding compound that is disposed around the first molding compound. In other words, the package structure may fulfill diversified product size by utilizing the second molding compound. In addition, there is no RDLs and dielectric layer on or in the second molding compound. Therefore, the cost of manufacturing the package structure can be decreased.

According to some embodiments, a package structure includes a semiconductor device, a first molding compound, a through-via, a first dielectric layer, a first redistribution line, and a second molding compound. The first molding compound is in contact with a sidewall of the semiconductor device. The through-via is in the first molding compound and is electrically connected to the semiconductor device and the through-via. The first dielectric layer is over the semiconductor device. The first redistribution line is in the first dielectric layer and is electrically connected to the semiconductor device. The second molding compound is in contact with a sidewall of the first dielectric layer.

According to some embodiments, a package structure includes a semiconductor device, a first molding compound, a through-via, a first dielectric layer, a first redistribution line, and a second molding compound. The first molding compound is in contact with a sidewall of the semiconductor device. The through-via is in the first molding compound and is electrically connected to the semiconductor device. The first dielectric layer is over the semiconductor device. The first redistribution line is in the first dielectric layer and is electrically connected to the semiconductor device and the through-via. The second molding compound around the first molding compound, and the first molding compound and the second molding compound have an interface.

According to some embodiments, a method of forming a package structure includes forming a through-via over a dielectric layer, wherein the through-via is electrically connected to a redistribution line in the dielectric layer; disposing a semiconductor device over the dielectric layer; forming a first molding compound over the dielectric layer, wherein the semiconductor device and the through-via are embedded in the first molding compound; and forming a second molding compound around the first molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor device;
   a first molding compound in contact with a sidewall of the semiconductor device;
   a through-via in the first molding compound and electrically connected to the semiconductor device;
   first and second dielectric layers between which is the semiconductor device;
   a first redistribution line in the first dielectric layer and electrically connected to the semiconductor device and the through-via; and
   a second molding compound in contact with a sidewall of the first dielectric layer, wherein a thickness of the second molding compound is substantially the same as a total thickness of the first molding compound, the first dielectric layer, and the second dielectric layer.

2. The package structure of claim 1, wherein the first molding compound is surrounded by the second molding compound.

3. The package structure of claim 1, wherein the first molding compound is in contact with the second molding compound.

4. The package structure of claim 1, wherein the first dielectric layer is surrounded by the second molding compound.

5. The package structure of claim 1, wherein a thickness of the first molding compound is smaller than a thickness of the second molding compound.

6. The package structure of claim 1,
   wherein the package structure further comprises:

a second redistribution line in the second dielectric layer and electrically connected to the semiconductor device.

7. The package structure of claim 1, wherein the second molding compound is in contact with a sidewall of the second dielectric layer.

8. The package structure of claim 1, wherein a bottom surface of the second dielectric layer is substantially coplanar with a bottom surface of the second molding compound.

9. The package structure of claim 1, wherein a top surface of the first dielectric layer is substantially coplanar with a top surface of the second molding compound.

10. A package structure, comprising:
a semiconductor device;
a first molding compound in contact with a sidewall of the semiconductor device;
a through-via in the first molding compound and electrically connected to the semiconductor device;
first and second dielectric layers between which is the semiconductor device;
a first redistribution line in the first dielectric layer and electrically connected to the semiconductor device and the through-via; and
a second molding compound around only sidewalls of the first molding compound, the first dielectric layer, and the second dielectric layer, wherein the first molding compound and the second molding compound have an interface.

11. The package structure of claim 10, wherein the second molding compound is in contact with the first dielectric layer.

12. The package structure of claim 10, wherein the first dielectric layer and the second molding compound have an interface.

13. The package structure of claim 10, wherein the second molding compound is free from a conductive feature.

14. A method of forming a package structure, the method comprising:

forming a through-via over a first dielectric layer, wherein the through-via is electrically connected to a redistribution line in the first dielectric layer;
disposing a semiconductor device over the first dielectric layer;
forming a first molding compound over the first dielectric layer, wherein the semiconductor device and the through-via are embedded in the first molding compound;
forming a second dielectric layer over the first molding compound; and
forming a second molding compound around the first molding compound such that the second molding compound is substantially flush with a top surface of the second dielectric layer and is on a sidewall of the first dielectric layer.

15. The method of claim 14, further comprising:
sawing through at least the first molding compound.

16. The method of claim 15, wherein the second molding compound is formed after the sawing.

17. The method of claim 14, further comprising:
patterning the first dielectric layer to expose the redistribution line; and
forming a solder bump electrically connected to the redistribution line.

18. The method of claim 17, wherein the second molding compound is formed after the forming the solder bump.

19. The method of claim 17, further comprising:
using a die attach film to attach the first dielectric layer to a carrier before the forming the second molding compound, wherein the solder bump is embedded in the die attach film.

20. The method of claim 14, further comprising:
sawing through the second molding compound.

* * * * *